United States Patent
Perner et al.

(10) Patent No.: US 6,930,370 B2
(45) Date of Patent: Aug. 16, 2005

(54) MEMORY WITH CONDUCTORS BETWEEN OR IN COMMUNICATION WITH STORAGE UNITS

(75) Inventors: Frederick A. Perner, Palo Alto, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/681,483

(22) Filed: Oct. 8, 2003

(65) Prior Publication Data

US 2005/0077555 A1 Apr. 14, 2005

(51) Int. Cl.$^7$ ............................................. G11O 11/00
(52) U.S. Cl. ........................ 257/423; 257/422; 365/170; 365/171; 365/172; 365/173
(58) Field of Search .................................. 257/359, 422, 257/423, E27.102; 365/66, 130, 158, 170, 171, 173

(56) References Cited

U.S. PATENT DOCUMENTS

| | | | |
|---|---|---|---|
| 5,640,343 A | * | 6/1997 | Gallagher et al. .......... 365/171 |
| 5,956,267 A | | 9/1999 | Hurst et al. |
| 6,147,900 A | * | 11/2000 | Pohm .......................... 365/158 |
| 6,153,443 A | | 11/2000 | Durlam et al. |
| 6,169,686 B1 | | 1/2001 | Brug et al. |
| 6,259,644 B1 | | 7/2001 | Tran et al. |
| 6,261,893 B1 | | 7/2001 | Chang et al. |
| 6,351,408 B1 | * | 2/2002 | Schwarzl et al. ........... 365/158 |
| 6,424,565 B2 | | 7/2002 | Brug et al. |
| 6,788,570 B2 | * | 9/2004 | Kim et al. .................. 365/171 |

* cited by examiner

*Primary Examiner*—Minhloan Tran
*Assistant Examiner*—Thomas L. Dickey (57) ABSTRACT

A memory includes an array of magnetic memory cells, each magnetic memory cell being adapted to store a bit of information, interconnects in communication with the magnetic memory cells, and conductors in communication with the magnetic memory cells and the interconnects, the conductors filling spaces between adjacent magnetic memory cells of the array.

25 Claims, 7 Drawing Sheets

MEMORY WITH CONDUCTORS BETWEEN OR IN COMMUNICATION WITH STORAGE UNITS

BACKGROUND OF THE INVENTION

Solid-state memories have a wide variety of applications, particularly in computer systems, and are often constructed of semiconductor materials. Semiconductor memories include magnetic random access memories (MRAMs), dynamic random access memories (DRAMs), and persistent or non-volatile memories such as flash memories, to name a few examples.

One type of solid-state memory is typically arranged as one or more arrays of memory cells or storage cells. The structure of each storage cell provides a mechanism for storing a bit of information. For example, the storage cells in a typical DRAM include structures that form a capacitor for storing information as an electrical charge. In addition, the storage cells in a typical flash memory include structures that form a floating gate for persistent storage of an electrical charge.

Such specialized structures in prior solid-state memories typically require critical alignment in order to achieve high storage-cell densities. For example, high-density DRAM cells usually require critical alignments in the trenched or stacked capacitor structures contained therein. In addition, flash cells typically require critical alignment among the floating-gate structures contained therein. Storage cell structures are often formed using multiple pattern masks, according to the particular process technology used for fabrication of the solid-state memory. Typically, the critical alignments of such structures require a relatively precise alignment among the pattern masks. Unfortunately, process technologies that achieve precise alignment of pattern masks are usually expensive and therefore greatly increase the cost of prior high-density solid-state memories.

SUMMARY OF THE INVENTION

A memory includes an array of magnetic memory cells, each magnetic memory cell being adapted to store a bit of information, interconnects in communication with the magnetic memory cells, and conductors in communication with the magnetic memory cells and the interconnects, the conductors filling spaces between adjacent magnetic memory cells of the array.

DETAILED DESCRIPTION

Figure 1:
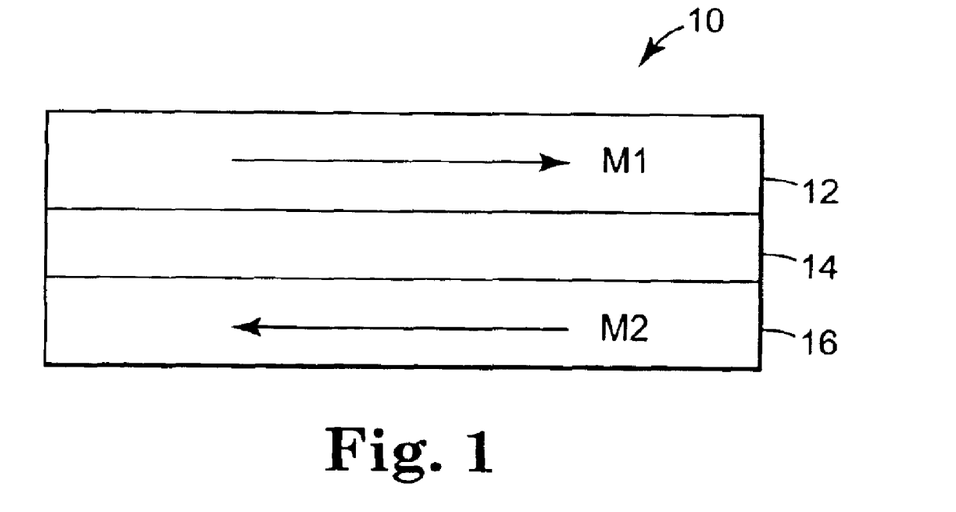
FIGS. 1–2 illustrate the storage of a data bit in a magnetic storage cell, according to an embodiment of the invention.
Figure 2:
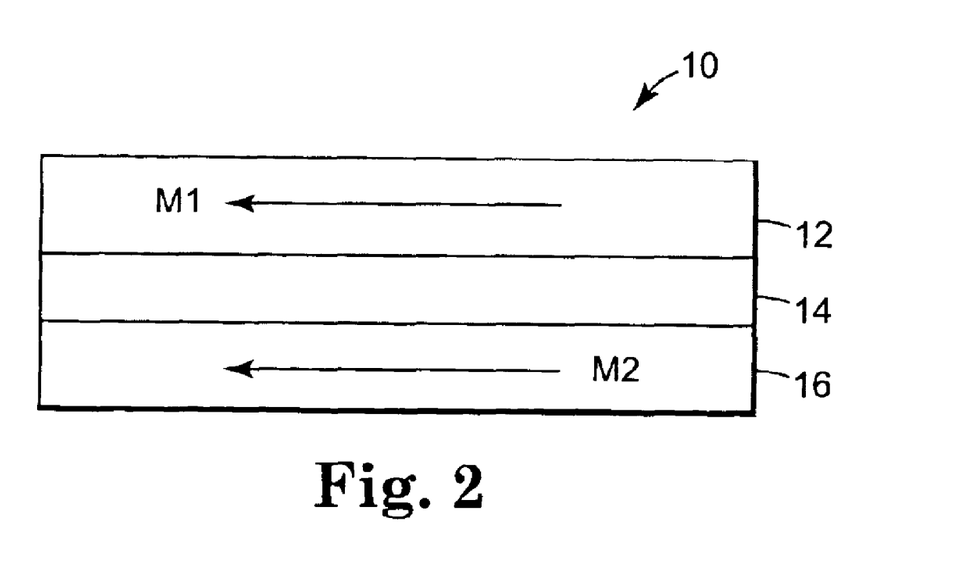

FIGS. 1–2 illustrate magnetic storage cell 10 of a solid-state memory that includes an array of such cells. Cell 10 uses magnetic fields to store information, with each cell in the memory enabling storage of a corresponding bit of information, referred to as a data bit. Magnetic storage cell 10 includes magnetic film 12 and magnetic film 16, which are separated by a dielectric region 14. The orientation of magnetization in magnetic film 12 is shown as M1, and the orientation of magnetization in magnetic film 16 is shown as M2. One of magnetic films 12 and 16 has a fixed orientation of magnetization, while the other has a non-fixed orientation of magnetization. The magnetic film having a non-fixed orientation of magnetization is the active magnetic film of magnetic storage cell 10. The active magnetic film rotates its orientation of magnetization in response to electrical signals applied to selected top and bottom conductors of the solid state memory during write operations to magnetic storage cell 10. In one embodiment, a first logic state of the data bit stored in magnetic storage cell 10 is indicated when M1 and M2 are parallel, i.e. oriented in the same direction, and a second logic state is indicated when M1 and M2 are anti-parallel, i.e. oriented in opposite directions.

According to embodiments of the invention, either top magnetic film 12 or bottom magnetic film 16 is a pinned magnetic film, for example. In one embodiment, magnetic film 16 is pinned with a fixed orientation of magnetization M2, while magnetic film 12 has non-fixed orientation of magnetization M1. The orientation of magnetization M1 in magnetic film 12 changes in response to electrical signals applied to selected top and bottom conductors during write operations to magnetic storage cell 10.

FIG. 1 illustrates a "0" logic state of a data bit stored in magnetic storage cell 10. In the "0" logic state, the orientation of magnetization in magnetic film 12 (M1) is anti-parallel or opposite to the orientation of magnetization M2 in magnetic film 16. FIG. 2 shows a "1" logic state of magnetic storage cell 10. In the "1" logic state, M1 is parallel to or oriented in the same direction as M2.

Magnetic storage cell 10 is read by applying a voltage potential, which is optionally referred to as a read voltage, across selected top and bottom conductors of the memory. The read voltage causes an electrical current, also known as a sense current, to flow between magnetic films 12 and 16 as electrical charge migrates through dielectric region 14 according to a phenomenon known as spin tunneling. Storage cell 10 optionally is referred to as a spin tunneling storage cell.

The resistance of magnetic storage cell 10 differs according to the orientations of M1 and M2. When M1 and M2 are anti-parallel, the "0" logic state, the resistance of magnetic storage cell 10 is at its highest. On the other hand, the resistance of magnetic storage cell 10 is at its lowest when M1 and M2 are parallel, which corresponds to the "1" logic state. As a consequence, the logic state of the data bit stored in magnetic storage cell 10 is determinable by measuring its resistance. The resistance of magnetic storage cell 10 is reflected by the magnitude of the sense current that flows in response to the read voltage applied to the selected top and bottom conductors.

Figure 3:
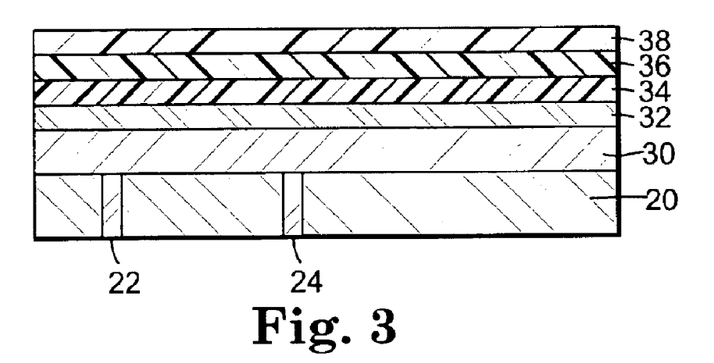
FIG. 3 is a cross-sectional view showing a series of materials that are initially deposited onto a substrate and that are subsequently formed into conductors and magnetic storage cells, according to an embodiment of the invention.

FIG. 3 illustrates initial formation of an array of magnetic storage cells and corresponding conductors on substrate 20. Substrate 20 includes a structural or base substrate formed of silicon, for example, and a layer of dielectric or other insulator supported by or in contact with the structural substrate. For simplicity of illustration, FIG. 3+ show just the insulator layer portion of substrate 20. Each magnetic memory cell comprises an active layer having a non-fixed magnetization and a reference layer having a fixed magnetization, according to one embodiment, as described above. Substrate 20 includes initially exposed interconnects or vias 22, 24 in the form of metal posts connecting to circuits in the structural or base portion of substrate 20, for example. In one embodiment, substrate 20 accommodates formation of vias 22, 24 at least partially therethrough and support electronics for solid-state memory, such as sense-amplifier and multiplexor circuitry. The process for the formation of magnetic storage cells 10 and the conductors does not require that substrate 20 comprise a semiconductor material. Additionally, vias 22, 24 as shown are for purposes of illustration and are not necessarily to scale. Although just two vias 22, 24 are illustrated, embodiments of the invention contemplate more than two vias passing at least partially through substrate 20, and vias located in positions other than or in addition to those specific positions shown in the figures.

FIG. 3 shows a series of materials 30–38 that are initially deposited onto substrate 20. A layer of conductor material 30 is deposited onto substrate 20 and provides for the formation of the conductors of the memory. More specifically, conductor material 30 is used to form the bottom conductors of the solid-state memory. Conductor material 30 is a sheet or other layer of conductive material such as copper, aluminum, or gold, or alloys containing these materials, for example.

In one embodiment, antiferromagnetic material 32 is deposited on top of conductor material 30. Antiferromagnetic material 32 provides a magnetic pinning material for fixing the orientations M2 in magnetic storage cells 10 to be formed on substrate 20. Antiferromagnetic material 32 optionally is iron-manganese (FeMn) or nickel-manganese (NiMn). Alternative materials for antiferromagnetic material 32 include nickel oxide (NiO), platinum-manganese (PtMn) and iridium-manganese (IrMn), for example.

Magnetic film 34 is deposited on top of antiferromagnetic material 32. The effect of magnetic exchange coupling between magnetic film 34 and antiferromagnetic material 32 pins the orientation of the magnetization in magnetic film 34. Magnetic film 34 provides a layer of pinned magnetic material for forming the pinned magnetic film regions of magnetic storage cells 10. For example, magnetic film 34 is subsequently formed into pinned magnetic film 16 of magnetic storage cell 10. Magnetic film 34 is optionally nickel-iron (NiFe) or cobalt, or alloys or layers comprised of combinations of these materials. Alternative materials for magnetic film 34 include $Fe_3O_4$ and $CrO_2$, or other ferromagnetic or ferrimagnetic materials, for example.

Insulating material 36 is deposited on magnetic film 34. Insulating material 36 provides a layer for forming the dielectric regions of magnetic storage cells 10, such as dielectric region 14 of magnetic storage cell 10. In one embodiment, insulating material 36 is aluminum-oxide ($Al_2O_3$). Alternative materials for insulating material 36 include silicon-dioxide ($SiO_2$), tantalum-oxide ($Ta_2O_5$), and silicon-nitride ($Si_3N_4$), for example.

Magnetic film 38 is deposited on top of insulating material 36. Magnetic film 38 provides a layer of material for forming the active regions of magnetic storage cells 10, such as magnetic film 12 of storage cell 10. Magnetic film 38 optionally is nickel-iron (NiFe) or cobalt, or alloys or layers comprised of combinations of these materials. Alternative materials for magnetic film 38 include $Fe_3O_4$ and $CrO_2$, or other ferromagnetic or ferrimagnetic materials, for example.

Figure 4:
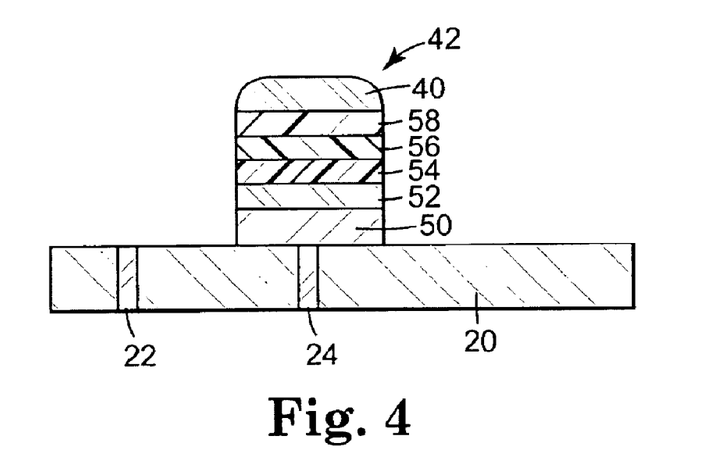
FIG. 4 is a cross-sectional view showing patterning of the material shown in FIG. 3, according to an embodiment of the invention.

FIG. 4 illustrates a patterning of the material shown in FIG. 3. FIG. 4 (and FIGS. 5–10) illustrates the bottom conductor in cross-section parallel to its long dimension. The patterning is performed by forming lines of photo-resist, including photo-resist 40, on top of magnetic film 38 using photolithography. The line of photo-resist 40 defines the length of a bottom conductor of the memory and one dimension of magnetic storage cells 10. An etching process is performed to remove the materials from substrate 20 that are not protected by photo-resist. Etching may be done by ion milling, wet chemical etching, or reactive ion etching, for example. The protection provided by photo-resist 20 results in the formation of stacked structure 42 from the materials shown in FIG. 4.

Stacked structure 42 includes bottom conductor 50, which is a remnant of conductor material 30 and which is shown in its long dimension in FIGS. 4–10. Stacked structure 42 also includes a strip of antiferromagnetic material 52, which remains from antiferromagnetic material 32. Strip of antiferromagnetic material 52 pins the magnetic orientations M2 of magnetic storage cell 10 in a direction parallel to the length of conductor 50. Stacked structure 42 also includes a strip of magnetic film 54, a strip of dielectric material 56, and a strip of magnetic film 58, which remain from magnetic film 34, dielectric material 36, and magnetic film 38, respectively. The strips of magnetic film 54, dielectric material 56, and magnetic film 58 are to be formed into magnetic storage cells 10 with subsequent patterning.

Figure 5:
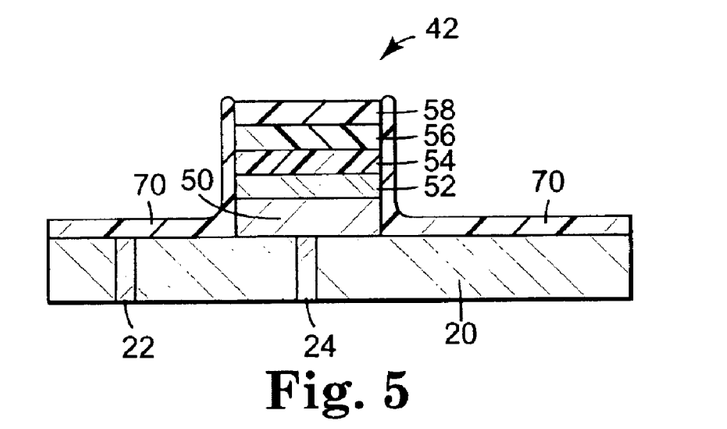
FIG. 5 is a cross-sectional view showing a layer of protective dielectric that covers the sides of patterned stacked structures and exposed area of a substrate, according to an embodiment of the invention.
Figure 6:
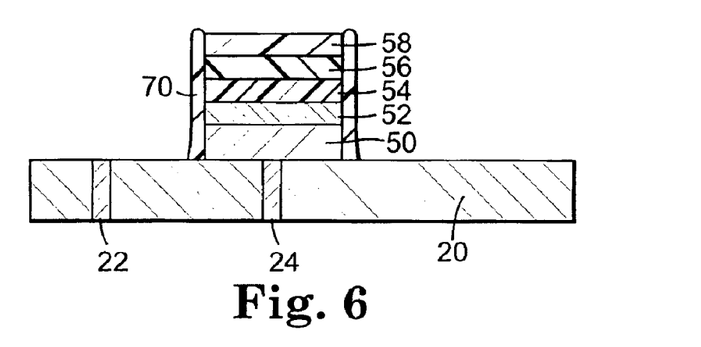
FIG. 6 is a cross-sectional view showing the protective dielectric layer partially removed, according to an embodiment of the invention.

FIG. 5 is a cross-sectional view that shows a thin layer of protective dielectric 70 that initially covers the sides of stacked structure 42, the exposed area of substrate 20, and via 22. Protective dielectric 70 is initially deposited over stacked structure 42, including photo-resist 40 and exposed areas of substrate 20, as a thin layer, for example a layer of about 500 angstroms or less, of dielectric material. The layer is optionally about 100, about 200, about 300, about 400 or about 500 angstroms thick, for example. Protective dielectric 70 then is removed over most of substrate 20 via etching, for example, to expose via 22 while leaving sides of stacked structure 42 insulated. After such removal, according to one embodiment, protective dielectric 70 overlies substrate 20 only immediately adjacent stacked structure 42. Photo-resist 40 and other lines of photo-resist used for patterning conductors of the memory are also removed, using, for example, an ultrasonic agitator with a solvent. The resulting protective dielectric 70, as shown in FIG. 6, for example, generally prevents or reduces short circuits between edges of the magnetic films 54 and 58 after the top conductors of the memory are formed.

Figure 7:
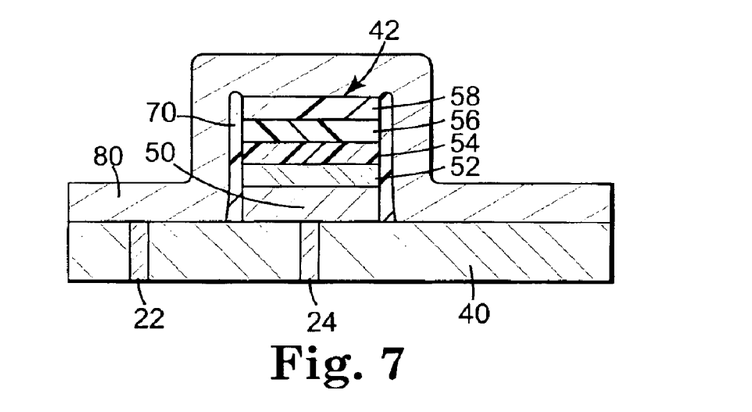
FIG. 7 is a cross-sectional view showing a top conductor material deposited over the stacked structure and the protective dielectric, according to an embodiment of the invention.

FIG. 7 is a cross-sectional view showing conductor material 80 deposited over stacked structure 42 and protective dielectric 70. Conductor material 80 provides a layer of conductive material for the formation of top conductors of the memory. Conductor material 80 is in direct contact with via 22. Conductor material 80 is formed of conductive material such as copper, aluminum, or gold, or alloys containing these materials, for example.

Figure 8:
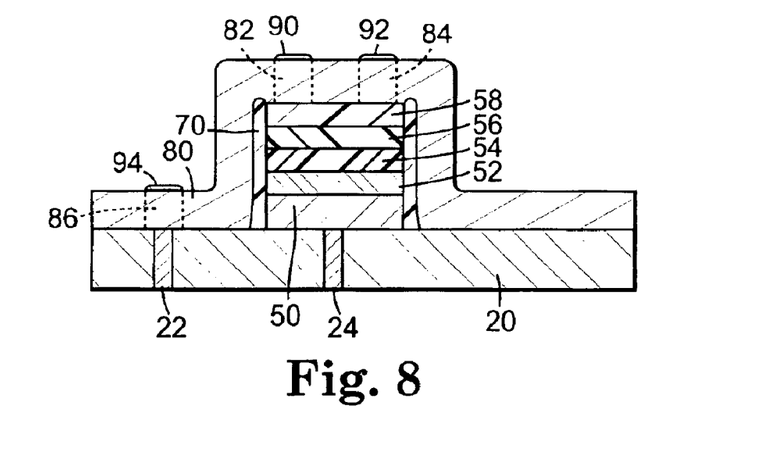
FIG. 8 is a cross-sectional view showing patterning of the top conductor material, according to an embodiment of the invention.

Referring to FIG. 8, top conductors 82, 84, 86 are patterned from conductor material 80. The patterning of top conductors 82, 84 automatically aligns top conductors 82, 84 and the layers of each magnetic storage cell 10. Top conductors 82, 84 are patterned by forming lines of photo-resist, including lines of photo-resist 90, 92, on top of conductor material 80 using photolithography. A line of photo-resist 94 is deposited on top of conductor material 80 in the region over via 22, to form top conductor 86 in contact with via 22.

Figure 9:
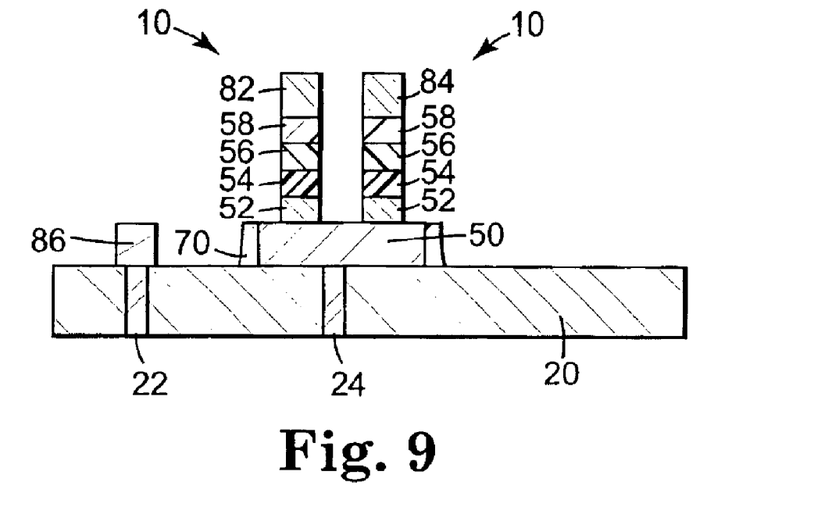
FIG. 9 is a cross-sectional view showing patterned top conductor material, according to an embodiment of the invention.

An ion milling process or other etching process is used to remove materials not protected by photo-resist 90, 92, 94. The process is used to remove materials down to bottom conductor 50 in stacked structure 42, as shown in FIG. 9. Photo-resist 90, 92, 94 is also stripped away after the process. FIG. 9 shows two magnetic storage cells 10, each including magnetic film 58 and dielectric region 56 formed from the deposited strip of magnetic film 58 and the deposited strip of dielectric material 56, respectively. Each cell 10 also includes antiferromagnetic material 52, which remains from deposited strip of antiferromagnetic material 52, magnetic film 54, which remains from originally deposited strip of magnetic film 54, and bottom conductor 50.

The patterning of top conductors 82 and 84 patterns and automatically aligns the active magnetic films in magnetic storage cells 10. As a consequence, there is no need to use separate pattern masks for conductors 82, 84 and the active layers or dielectric layers of magnetic storage cells 10, nor to precisely align any such pattern masks. Additionally, top conductors 82, 84 of cells 10 are deposited simultaneously with top conductor 86, which is connected directly to via 22 formed in substrate 20. Conductors 82, 84 and conductor 86 are in electrical communication with each other, according to embodiments of the invention. Contact between via 22 and conductor 86 need not be patterned or etched out of protective dielectric 70. Instead, protective dielectric 70 is already removed over most of substrate 20 upon deposition of conductor material 80, for example, to expose via 22 to conductor material 80 while leaving sides of stacked structure 42 insulated. Conductor 86 is deposited on via 22, and conductors 82, 84 are deposited on magnetic memory cells 10.

Figure 10:
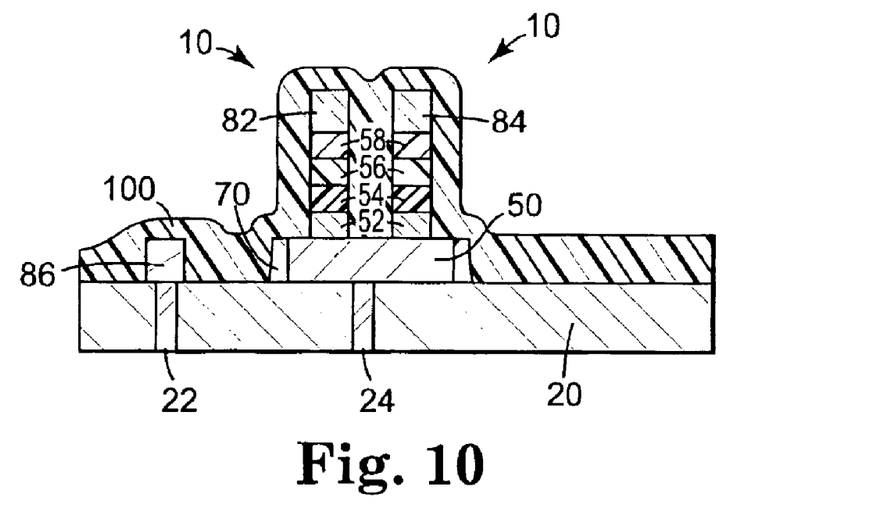
FIG. 10 is a cross-sectional view showing a deposited protective dielectric layer, according to an embodiment of the invention.

As shown in FIG. 10, the structure shown in FIG. 9 is covered with an insulating material, for example dielectric layer 100. Dielectric layer 100 is optionally planarized, and another array of magnetic storage cells is formed on top of magnetic storage cells 10. This is possible because no single crystalline semiconductor substrate is required. The ability to have many layers of magnetic storage cells enhances the overall density that can be attained in the solid-state memory. FIG. 10 is a representative side cross-sectional view taken along line 10—10 of FIG. 11.

Figure 11:
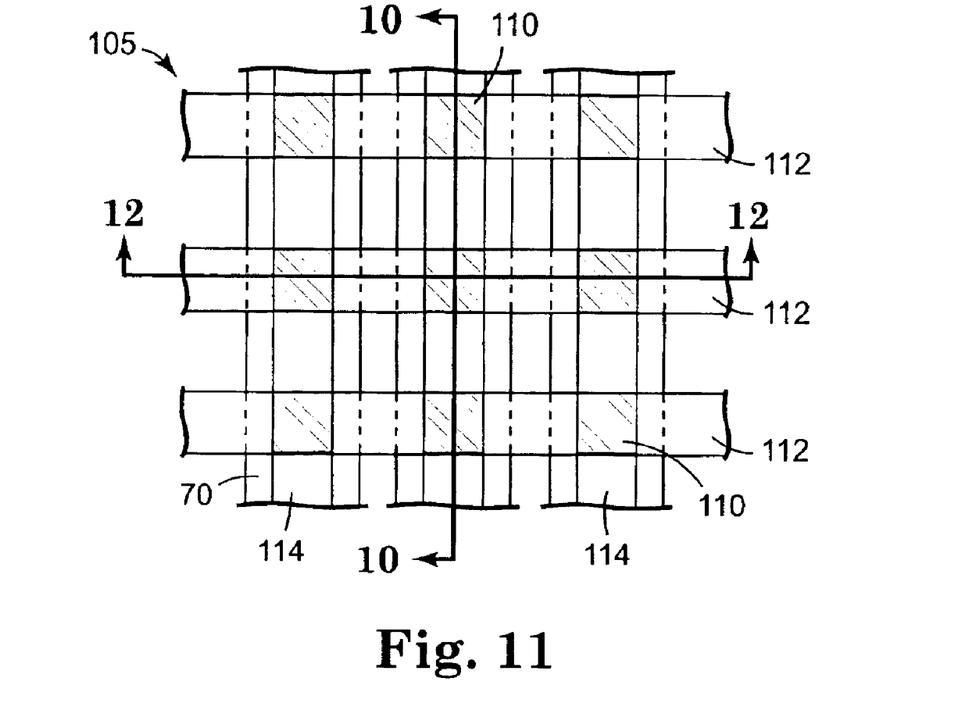
FIG. 11 is a top view of a memory, according to an embodiment of the invention.

FIG. 11 is a top view of a representative solid-state memory 105, which includes an array of magnetic storage cells 110 and an array of top conductors 112 and bottom conductors 114 that enable read and write access to magnetic storage cells 110. Cells 110, top conductors 112, and bottom conductors 114 of FIG. 11 are representative of cells 10, top conductors 82, 84, 86 and bottom conductor 50, respectively, of FIG. 10. Memory 105 optionally includes multiple layers of conductors 112, 114 and cells 110, with interconnecting vias.

Figure 12:
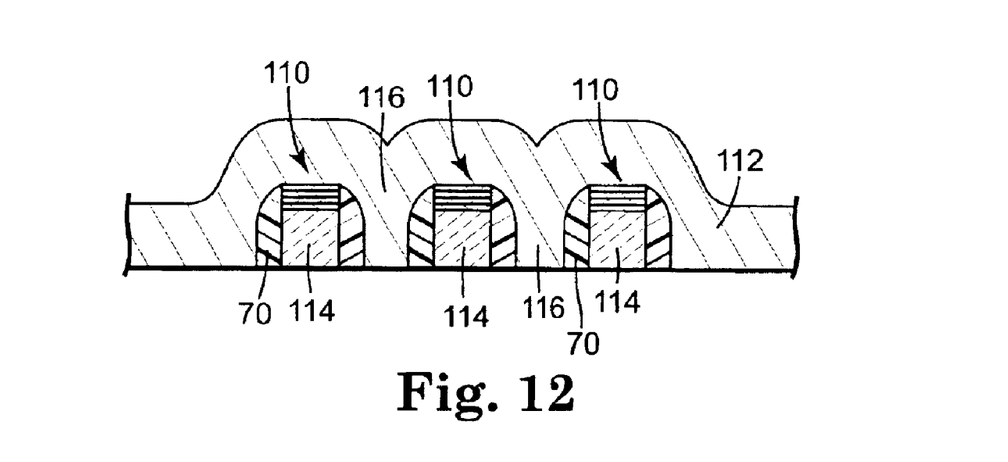
FIG. 12 is a cross-sectional view of the FIG. 11 memory, according to an embodiment of the invention.

FIG. 12 is a representative side cross-sectional view of memory 105 taken along line 12—12 of FIG. 11. Top conductor 112 fills spaces 116 between adjacent cells 110, conductor 112 being relatively thick and spaces 116 between cells 110 being relatively small. Top conductor 112 is deposited between adjacent bottom conductors 114 and between adjacent magnetic memory cells 110 of the array. Insulating dielectric material or layer 70 is disposed between top conductors 112 and bottom conductors 114 around or on the sides of the stack of each storage cell 110, to insulate storage cells 110. Memory 105 is optionally one of a number of different types of memory, for example magnetic random access memory (MRAM), read-only memory (ROM), programmable read-only memory (PROM), one-time programmable (OTP) memory, and phase-change memory, for example.

Storage cells 110 are one example of a means for storing information having logic states, with each cell comprising a storage unit. Intervening gaps or spaces 116 are between adjacent storage units 110. Generally orthogonal conductors 112, 114 are an example of a means useful for sensing the logic states of the means used for storing information. Generally, the means used for sensing fills the intervening gaps of the means used for storing information.

According to additional embodiments of the invention, a memory includes an array of magnetic memory cells 10, 110, each magnetic memory cell being adapted to store a bit of information and/or comprising a patterned stack. Vias or interconnects 22, 24 (e.g. FIG. 10) are in communication with the magnetic memory cells, and conductors 112, 114 are in communication with the magnetic memory cells and interconnects 22, 24. Interconnects or vias located in positions in addition to or other than those illustrated in e.g. FIG. 10 are also contemplated. For example, two interconnects 24 are contemplated for connection to each conductor 50, e.g. to drive a write current. Conductors 112 fill spaces 116 between adjacent magnetic memory cells of the array. Conductors 112 comprise top conductors formed by a patterning process that also patterns the magnetic memory cells. The array of magnetic memory cells is supported on substrate 20, and interconnects 22, 24 connect to circuits in substrate 20. Bottom conductors 114 are disposed generally orthogonally to top conductors 112, each bottom conductor 114 supporting multiple magnetic memory cells of the array and thus being a conductor common to those cells. The cells overlie or otherwise are in communication with first vias or interconnects 24, and top conductors 112 are deposited over insulating layers 70 and the magnetic cells, the top conductors also overlying second vias or interconnects 22 of the memory structure. An advantage of filling regions between bottom conductor with top conductor is that the top conductor is thicker in regions in between the bit cells, and thinner on top of the bit cells. This results in lower resistance conductors, and if the conductors are not cladded, then a thin conductor on top of the bit cell is desirable to generate higher field.

Figure 13:
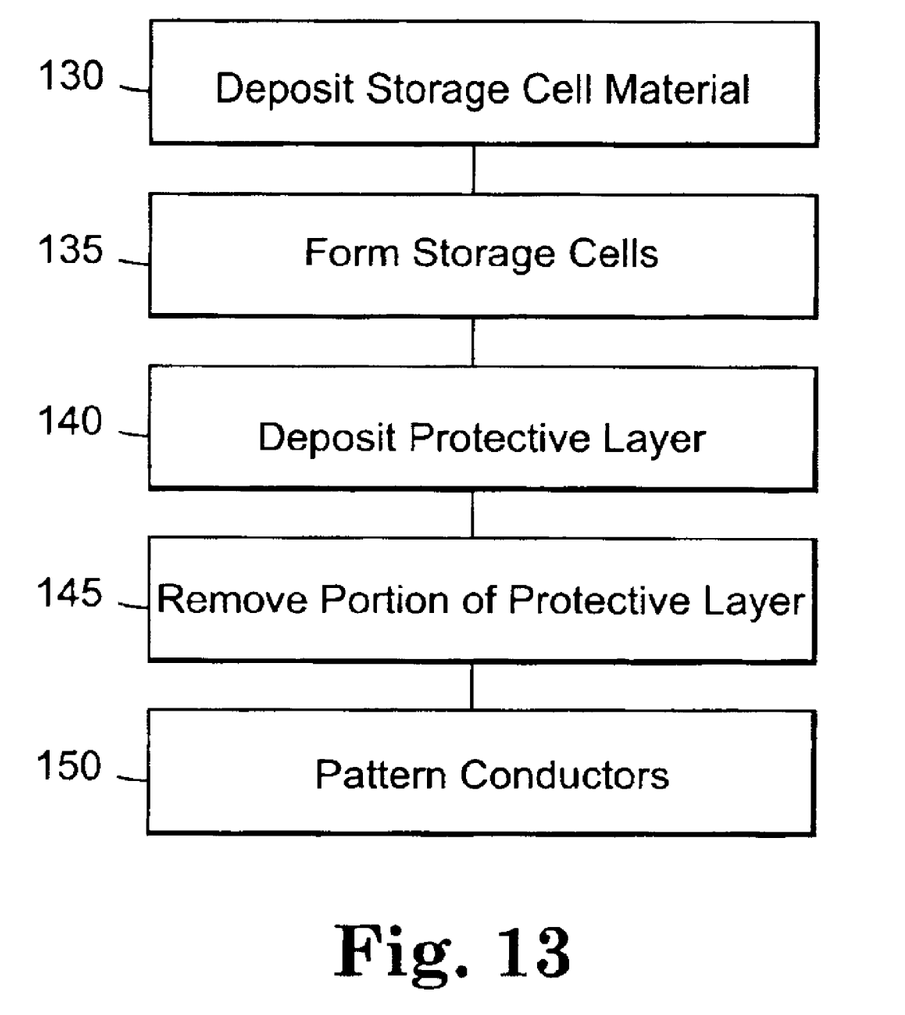
FIG. 13 is a flow chart showing a method according to an embodiment of the invention.

With reference to FIG. 13, a method of making an electronic storage device comprising a first conductor formed on a substrate, the first conductor contacting a first post extending at least partially through the substrate, includes, at 130, depositing storage cell material on the first conductor. The method also includes, at 135, forming storage cells from the storage cell material, wherein adjacent storage cells define intervening spaces bordered by the first conductor. At 140, the method includes depositing a protective layer on the substrate and the storage cell material. Removing a portion of the protective layer from the substrate follows, at 145, such that the remaining protective layer overlies the substrate only immediately adjacent the storage cell material, as described previously with reference to FIG. 6, for example. Removing 145 causes a second post extending at least partially through the substrate to be exposed. The method also includes, at 150, patterning second conductors on the storage cell material and on the second post. Patterning 150 also patterns the storage cell material to form a plurality of storage cells on the first conductor, with an active layer and, optionally, a reference layer and a dielectric region of the storage cell material being patterned. Second-conductor material forming the second conductors is deposited to generally fill the spaces between adjacent storage cells. The second-conductor material is deposited generally simultaneously on the storage cell material and over the second post. According to embodiments of the invention, the storage cells are patterned in one dimension when the bottom conductor is patterned, and in the other dimension when the top conductor is patterned.

Figure 14:
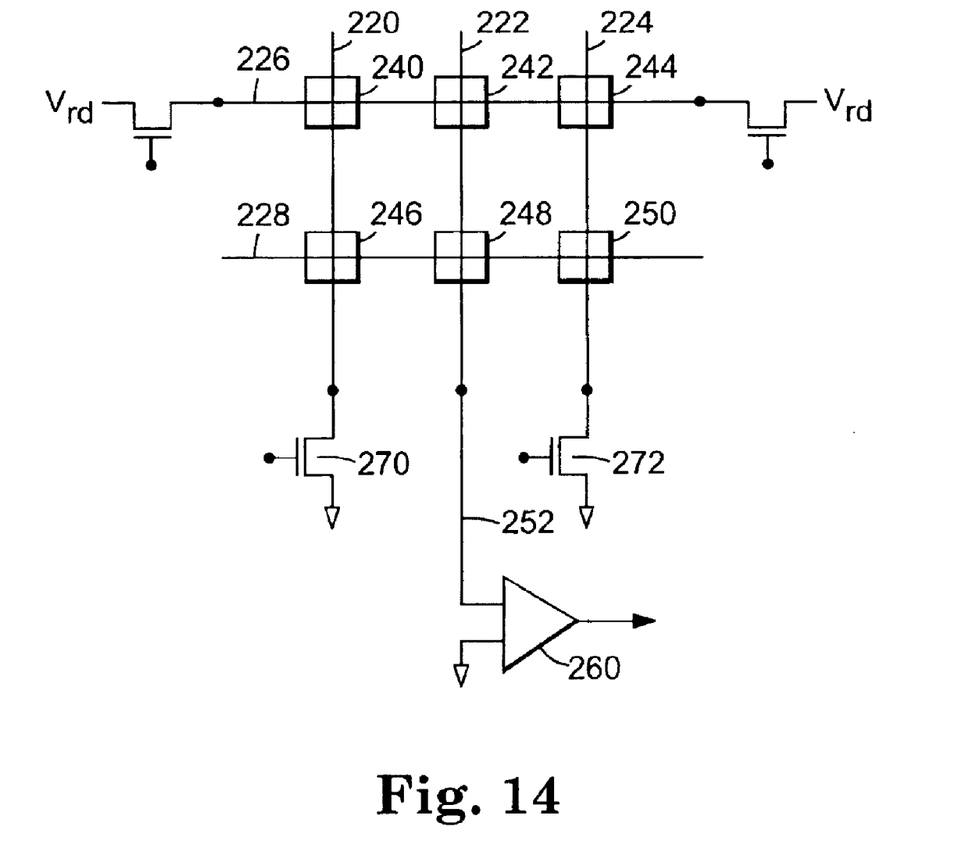
FIG. 14 shows an arrangement for reading a magnetic storage cell, according to an embodiment of the invention.

FIG. 14 shows an arrangement for reading cells 110 of memory 105, according to one embodiment of the invention. Memory 105 includes a set of bottom conductors 220, 222, 224, analogous to bottom conductors 114 of FIG. 11, and a set of top conductors 226, 228, analogous to top conductors 112 of FIG. 11, to enable read and write access to magnetic storage cells 240–250, which are analogous to cells 110 of FIG. 11. Magnetic storage cell 242, for example, is read by applying a read voltage $V_{rd}$ to conductor 226 and coupling conductor 222 to input 252 of current sense amplifier 260. The potential $V_{rd}$ across magnetic storage cell 242 causes a sense current to flow into input 252 of current sense amplifier 260. The magnitude of the sense current indicates the resistance of magnetic storage cell 242 and therefore its logic state. During the read operation, the conductors 220 and 224 are applied with a ground potential using a pair of transistors 270–272. In addition, input 252 of current sense amplifier 260 has a virtual ground potential, which means that conductor 222 has a virtual ground potential. The ground and virtual ground potentials of conductors 220–224 reduce the amount of current flow between the conductors 220–224. This current flow is known as leakage current. The reduced amount of leakage current in conductors 220–224 increases the signal to noise ratio during read operations on magnetic storage cell 10. The equalized potentials among conductors 220–224 is accomplishable using a variety of circuits. For example, transistors 270, 272 apply a potential $V_x$ to conductors 220 and 224, and input 252 has a potential of $V_x$. In addition, each of the conductors is couplable to an input of a corresponding current sense amplifier. The inputs of the current sense amplifiers optionally are virtual grounds or have some other potential, as long as the potentials of all the conductors 220–224 are equalized. Moreover, any combination of transistors and current sense amplifiers may be used to equalize the potentials of the conductors 220–224 during read operations.

The sensing system of FIG. 14 is just one example of a sensing system used with memories and magnetic cells according to embodiments of the invention. According to an alternate system, a pair of magnetic cells optionally defines a single bit, and sense amplifier 260 optionally is a differential sense amplifier, for example in the case of static random access memory (SRAM). One reference bit for a group of memory cells, and a corresponding sensing arrangement, are also contemplated, for example in the case of buffer random access memory (BRAM). Other sense amplifier types also are contemplated.

This disclosure describes etching to pattern the conductor and magnetic layers. Another process for patterning conductors, which may have advantages in certain situations, particularly if the conductors are Cu, for example, is the Damascene process. In this process, trenches are created in an insulator, the trenches are then filled with metal, for example Cu, and then the unwanted Cu on top of the insulator is removed by polishing. This results in generally planarized conductors. This process is particularly useful for patterning the top conductors in certain circumstances. The insulator around the Cu is etched off after Cu polishing, according to one embodiment, so that the patterned Cu lines then are used as masks to etch the underlying magnetic memory cells. This process also optionally is used to create the bottom conductor. The magnetic stack is deposited on top of the conductors after they are patterned. Electrical isolation between columns or rows then occurs due to shadowing during deposition of the magnetic layers. Additionally, this disclosure describes the case where the entire thickness of the magnetic stack is patterned when patterning the top conductor. It is not necessary to pattern the reference layer in this dimension; an unpatterned reference layer also is contemplated according to embodiments of the invention. The process of coating only the edges of a patterned structure known as "spacer" formation is contemplated for coating edges of the bottom conductors described herein.

The foregoing detailed description of the present invention is provided for the purposes of illustration and is not intended to be exhaustive or to limit the invention to the precise embodiments disclosed.

What is claimed is:

1. A memory, comprising:
   an array of magnetic memory cells, each magnetic memory cell having sides and opposite ends and being adapted to store a bit of information;
   interconnects in communication with the magnetic memory cells; and
   conductors in communication with the magnetic memory cells and the interconnects, the conductors filling spaces between adjacent magnetic memory cells of the array as viewed from the sides of the magnetic memory cells;
   wherein the conductors comprise top conductors, the memory further comprising bottom conductors disposed generally orthogonally to the top conductors, each bottom conductor supporting multiple magnetic memory cells of the array;
   further wherein the top conductors are deposited between the bottom conductors and between adjacent magnetic memory cells of the array.

2. The memory of claim 1, wherein the top conductors are formed by a patterning process that also patterns the magnetic memory cells.

3. The memory of claim 1, further comprising a substrate, wherein the array of magnetic memory cells is supported on the substrate and wherein the interconnects pass at least partially through the substrate.

4. The memory of claim 3, wherein the conductors contact the substrate between adjacent magnetic memory cells and said spaces are at a same elevation with respect to the substrate as the sides of the adjacent memory cells.

5. The memory of claim 1, wherein at least one of the conductors is deposited on at least one of the interconnects and at least one other of the conductors is deposited on at least one of the magnetic memory cells.

6. The memory of claim 1, wherein the conductors contact the opposite ends of the magnetic memory cells and are disposed along the sides of the magnetic memory cells.

7. The memory of claim 1, wherein the magnetic memory cells each comprise an active layer having a non-fixed magnetization and a reference layer having a fixed magnetization.

8. The memory of claim 1, wherein the conductors filling spaces between adjacent magnetic memory cells of the array are top conductors disposed between bottom conductors of the array and between the adjacent magnetic memory cells.

9. The memory of claim 1, wherein the bottom conductors are in communication with the magnetic memory cells; and
a dielectric material is disposed between the top conductors and the bottom conductors.

10. The memory of claim 9, wherein the dielectric material insulates the magnetic memory cells.

11. The memory of claim 1, wherein each magnetic memory cell comprises a patterned stack; the memory further comprising a dielectric layer disposed on sides of the patterned stack.

12. The memory of claim 11, wherein the dielectric layer is disposed on sides of the conductors.

13. The memory of claim 11, wherein straight lines extending directly between adjacent magnetic memory cells pass through the dielectric layers and through the conductors filling the spaces between the adjacent magnetic memory cells.

14. The memory of claim 1, wherein the top conductors extend between the magnetic memory cells and along the sides of the magnetic memory cells to a level of the bottom conductors.

15. A memory, comprising:
means for storing information having logic states, the means for storing comprising a plurality of storage units defining intervening gaps between adjacent storage units; and
means for sensing the logic states of the means for storing; wherein the means for sensing fills the intervening gaps of the means for storing and surrounds the plurality of storage units; further wherein the means for sensing surrounds ends and sides of the plurality of storage units in three dimensions.

16. The memory of claim 15, wherein the means for sensing comprises a plurality of top conductors and a plurality of bottom conductors extending generally orthogonally to the plurality of top conductors.

17. A memory structure, comprising:
magnetic cells deposited on first conductive layers, the magnetic cells in communication with first vias of the memory structure;
insulating layers deposited on sides of the magnetic cells and patterned edges of the first conductive layers;
second conductive layers deposited over the insulating layers and the magnetic cells, the second conductive layers contacting second vias of the memory structure; and
a substrate supporting the magnetic cells, wherein the first vias and the second vias are disposed through the substrate.

18. The memory structure of claim 17, wherein the second conductive layers fill gaps between adjacent magnetic cells.

19. The memory structure of claim 17, wherein multiple magnetic cells are deposited on a common first conductive layer.

20. The memory structure of claim 17, further comprising multiple conductors formed from the second conductive layers.

21. The memory structure of claim 20, wherein the multiple conductors directly contact the magnetic cells and directly overlie the second vias.

22. A memory, comprising:
an array of magnetic memory cells, each magnetic memory cell having sides and opposite ends and being adapted to store a bit of information;
interconnects in communication with the magnetic memory cells;
conductors in communication with the magnetic memory cells and the interconnects, the conductors filling spaces between adjacent magnetic memory cells of the array as viewed from the sides of the magnetic memory cells; and
a substrate, wherein the array of magnetic memory cells is supported on the substrate and wherein the interconnects pass at least partially through the substrate;
further wherein the conductors contact the substrate between adjacent magnetic memory cells and said spaces are at a same elevation with inspect to the substrate as the sides of the adjacent memory cells.

23. A memory, comprising:
an array of magnetic memory cells, each magnetic memory cell having sides and opposite ends and being adapted to store a bit of information;
interconnects in communication with the magnetic memory cells; and
conductors in communication with the magnetic memory cells and the interconnects, the conductors filling spaces between adjacent magnetic memory cells of the array as viewed from the sides of the magnetic memory cells;
wherein the conductors comprise top conductors, the memory further comprising bottom conductors disposed generally orthogonally to the top conductors, each bottom conductor supporting multiple magnetic memory cells of the array;
further wherein the top conductors extend between the magnetic memory cells and along the sides of the magnetic memory cells to a level of the bottom conductors.

24. A memory, comprising:
an array of magnetic memory cells, each magnetic memory cell having sides and opposite ends and being adapted to store a bit of information;
interconnects in communication with the magnetic memory cells; and
conductors in communication with the magnetic memory cells and the interconnects the conductors filling spaces between adjacent magnetic memory cells of the array as viewed from the sides of the magnetic memory cells;
wherein each magnetic memory cell comprises a patterned stack; the memory further comprising a dielectric layer disposed on sides of the patterned stack;
further wherein straight lines extending directly between adjacent magnetic memory cells pass through the dielectric layers and through the conductors filling the spaces between the adjacent magnetic memory cells.

25. A memory structure, comprising:
magnetic cells deposited on first conductive layers, the magnetic cells in communication with first vias of the memory structure;

insulating layers deposited on sides of the magnetic cells and patterned edges of the first conductive layers; and second conductive layers deposited over the insulating layers and the magnetic cells, the second conductive layers contacting second visa of the memory structure; wherein the second conductive layers fill gaps between adjacent magnetic cells.

* * * * *

UNITED STATES PATENT AND TRADEMARK OFFICE
CERTIFICATE OF CORRECTION

| | | |
|---|---|---|
| PATENT NO. | : 6,930,370 B2 | Page 1 of 1 |
| APPLICATION NO. | : 10/681483 | |
| DATED | : August 16, 2005 | |
| INVENTOR(S) | : Frederick A. Perner et al. | |

It is certified that error appears in the above-identified patent and that said Letters Patent is hereby corrected as shown below:

In column 10, line 24, in Claim 22, delete "inspect" and insert -- respect --, therefor.

In column 10, line 54, in Claim 24, delete "interconnects" and insert -- interconnects, --, therefor.

In column 11, line 5, in Claim 25, delete "visa" and insert -- vias --, therefor.

Signed and Sealed this

Twentieth Day of October, 2009

David J. Kappos
*Director of the United States Patent and Trademark Office*